United States Patent [19]

Pinkhasov

[11] Patent Number: 4,596,719
[45] Date of Patent: * Jun. 24, 1986

[54] MULTILAYER COATING METHOD AND APPARATUS

[75] Inventor: Eduard Pinkhasov, Mount Vernon, N.Y.

[73] Assignee: Wedtech Corp., Bronx, N.Y.

[*] Notice: The portion of the term of this patent subsequent to Aug. 27, 2002 has been disclaimed.

[21] Appl. No.: 667,641

[22] Filed: Nov. 2, 1984

Related U.S. Application Data

[63] Continuation-in-part of Ser. No. 626,056, Jun. 29, 1984, Pat. No. 4,537,794, which is a continuation-in-part of Ser. No. 614,434, May 25, 1984, Pat. No. 4,505,948, which is a continuation-in-part of Ser. No. 494,302, May 13, 1983, which is a continuation-in-part of Ser. No. 358,186, Mar. 15, 1982, Pat. No. 4,438,153, which is a continuation-in-part of Ser. No. 237,670, Feb. 24, 1981, Pat. No. 4,351,855.

[51] Int. Cl.$^4$ .................. B05B 1/24; C23C 13/00
[52] U.S. Cl. .................. 427/37; 118/723; 118/726; 427/250; 427/295; 427/422
[58] Field of Search .............. 427/34, 37, 250, 295, 427/422, 423, 404; 118/720, 723, 726, 50.1

[56] References Cited

U.S. PATENT DOCUMENTS

| | | | |
|---|---|---|---|
| 2,588,421 | 3/1952 | Shepard | 427/404 |
| 3,010,009 | 11/1961 | Ducati . | |
| 3,340,084 | 9/1967 | Eisenlohr | 427/423 |
| 3,491,015 | 1/1970 | Naff . | |
| 4,197,175 | 4/1980 | Moll et al. | 118/723 |

FOREIGN PATENT DOCUMENTS

| | | |
|---|---|---|
| 1636004 | 7/1971 | Fed. Rep. of Germany . |
| 1648968 | 10/1971 | Fed. Rep. of Germany . |
| 822793 | 1/1938 | France . |
| 979772 | 12/1950 | France . |
| 1400961 | 7/1964 | France . |
| 889018 | 2/1962 | United Kingdom . |
| 1061949 | 3/1967 | United Kingdom . |
| 1322670 | 7/1973 | United Kingdom . |
| 1392583 | 4/1975 | United Kingdom . |
| 1447224 | 8/1976 | United Kingdom . |
| 1452720 | 10/1976 | United Kingdom . |
| 2010919 | 7/1979 | United Kingdom . |
| 2055403 | 3/1981 | United Kingdom . |
| 2058843 | 4/1981 | United Kingdom . |
| 2093484 | 9/1982 | United Kingdom . |
| 2106545 | 4/1983 | United Kingdom . |

OTHER PUBLICATIONS

Article "Nickel Ferrite Thick Films Deposited by Vacuum-Arc Discharge" by Masahiko Naoe et al., Tokyo Institute of Technology (1979)–in English.

Primary Examiner—John H. Newsome
Attorney, Agent, or Firm—Karl F. Ross; Herbert Dubno

[57] ABSTRACT

The adhesion of conductive layers to ceramic substrates in the application of such layers by low-energy techniques is improved by interposing between the high-conductivity metal layer and the substrate a layer of refractory metal which is preferably also applied by low-energy vaporization. The metal layers can be provided in succession by reversing the polarity of electrodes composed of the metals of these layers which strike an arc vaporizing the metal to be deposited. One of the electrodes can be shifted out of position and replaced by a substitute electrode and the process repeated to deposit a further layer of metal from the substitute electrode on the substrate.

8 Claims, 5 Drawing Figures

MULTILAYER COATING METHOD AND APPARATUS

CROSS REFERENCE TO RELATED APPLICATIONS

This application is a continuation-in-part of my application Ser. No. 626,056 filed June 29, 1984 (now U.S. Pat. No. 4,537,794 issued Aug. 27, 1985) which is a continuation-in-part of Ser. No. 614,434 filed May 25, 1984 (now U.S. Pat. No. 4,505,948 of Mar. 19, 1985). That application, in turn, is a continuation-in-part of an application Ser. No. 494,302 copending therewith and filed May 13, 1983. Ser. No. 494,302 was a continuation-in-part of Ser. No. 358,186 filed Mar. 15, 1982 (U.S. Pat. No. 4,438,153) as a continuation-in-part of Ser. No. 237,670 filed Feb. 24, 1981 (U.S. Pat. No. 4,351,855) all of which contain subject matter which in part is disclosed herein and which are all incorporated in their entireties by reference herein. This application also deals with subject matter found in or related to disclosure document Nos. 078,377, 078,334, 078,329, all deposited in the U.S. Patent and Trademark Office on Feb. 26, 1979 and the disclosure document No. 082,283 deposited July 5, 1979, incorporated herein by reference.

FIELD OF THE INVENTION

My present invention relates to a multilayer coating method for substrates generally and specifically ceramics and, more particularly, to a method of making metal coatings of inter alia conductive metals such as nickel, copper, gold and silver, upon ceramic substrates, which are especially adherent.

BACKGROUND OF THE INVENTION

The above-mentioned copending applications and disclosure documents relate to the depositing of material from a vapor phase on a substrate and are applicable to the coating of a wide variety of materials on a wide variety of substrates and particularly materials which have been difficult to apply heretofore in adherent coatings to substrates which have not generally been able to receive such coatings without substantial alteration or various problems.

These documents in part have disclosed the coating of ceramics utilizing low-energy techniques with various coating materials including conductive layers so as to enable these ceramic bodies to be utilized in the semiconductor industry and to permit terminals, conductors or circuit elements to be applied to the coated regions by soldering or other fusion techniques.

The basic principle underlying these earlier methods was the generation of the vapor by striking of a low-voltage arc between two electrodes, one of which at least was vaporized to produce the vapor phase component which was deposited upon the substrate, contacted by vapor in a vacuum chamber. The vapor could be generated by striking the arc between a pool of metal and a counterelectrode under conditions disclosed in some of those applications, or by striking the arc between two electrodes without significant pool formation as disclosed in others of these applications, and these applications generally also describe the formation of compounds which are to be deposited upon substrates by reaction of material from one electrode with material from the other as the electrode materials are vaporized. The applications also describe how compounds can be formed between a vaporized metal and a carrier gas which can be introduced into the region of the arc.

Notwithstanding the advances represented in these earlier applications, including the advances in the coating of ceramics, the problem of coating certain high-conductivity metals such as gold and silver, but most notably copper, upon ceramics in economical and highly adherent coatings such that the conductive coatings can withstand the rigors of afterheating, e.g. heating during the application of conductive elements by soldering or other thermal fusion, has remained.

OBJECTS OF THE INVENTION

It is, therefore, the principal object of the present invention to provide an improved multilayer coating method of and especially a method for coating ceramics whereby the disadvantages of earlier coating methods are avoided and, particularly, the resulting coatings are not only initially highly adherent to the ceramic substrate but withstand subsequent heating and rigorous handling.

Another object of this invention is to provide a method of coating ceramic substrates which extends the principles of the aforedescribed copending applications.

SUMMARY OF THE INVENTION

These objects and others which will become apparent hereinafter are attained, in accordance with the present invention, by juxtaposing two electrodes of different metals, preferably a highly conductive and a highly refractory metal with a substrate which is preferably a ceramic body, and striking an arc between these electrodes in an evacuating chamber containing the electrodes and the substrate. According to the invention, the electrodes are first given a relative polarity, i.e. one is poled positively while the other is poled negatively to deposit the metal of one of these electrodes selectively while at the same time, it appears, depositing a small amount of this latter metal on the second electrode.

When polarity is then reversed, the metal vaporizes preferentially from the second electrode, initially including the small portion of the metal from the first electrode which is deposited thereon so that at the interface between the two layers a mixed composition of the metals is formed.

The disadvantages, which have hitherto been encountered when high conductivity metals, especially copper but also gold and silver, are applied to a ceramic substrate with respect to adhesion and especially with respect to adhesion after or during soldering or other welding of conductivity elements thereto, can be obviated if, prior to the application of the high conductivity metal, the ceramic is coated with a refractory metal in a comparatively small thickness and this intermediate layer of coating is in turn coated with the conductive metal.

More particularly, I have found that it is possible to deposit a coating of a thickness of, say, 5 to 10 microns of tungsten, molybdenum, titanium or zirconium as the refractory metal upon the substrate and thereafter to apply a coating of greater thickness, say 0.001 to 0.02 inch of copper or a copper alloy, gold, silver or some other nonrefractory metal, i.e. metal having a substantially lower boiling point than that of the refractory metal which is used.

Preferably, both coatings are applied utilizing the techniques described in the above-identified applications and especially Ser. No. 614,434. I have found that, when a two-electrode method is used, according to the invention, it is possible to constitute one electrode as the refractory metal and the other electrode as the nonrefractory metal and by regulating the polarity of the electrodes during the deposition, the particular metal which is deposited can be controlled.

With the present invention, I have found that it is possible to increase the adhesion, in terms of the force required to separate the coating from the substrate by 100 or more times, all other things being equal, when the thin refractory metal coating is applied between the copper coating and the ceramic substrate.

A ceramic substrate can be used in accordance with the present invention and masking techniques can be employed to ensure the formation of the deposit in any desired pattern.

According to an important feature of the invention, one of the two electrodes which are juxtaposed with the substrate can be moved out of alignment with the other electrode and replaced by a substitute electrode and the process repeated with the latter to additionally deposit at least a layer of the metal of the third electrode upon the second layer.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
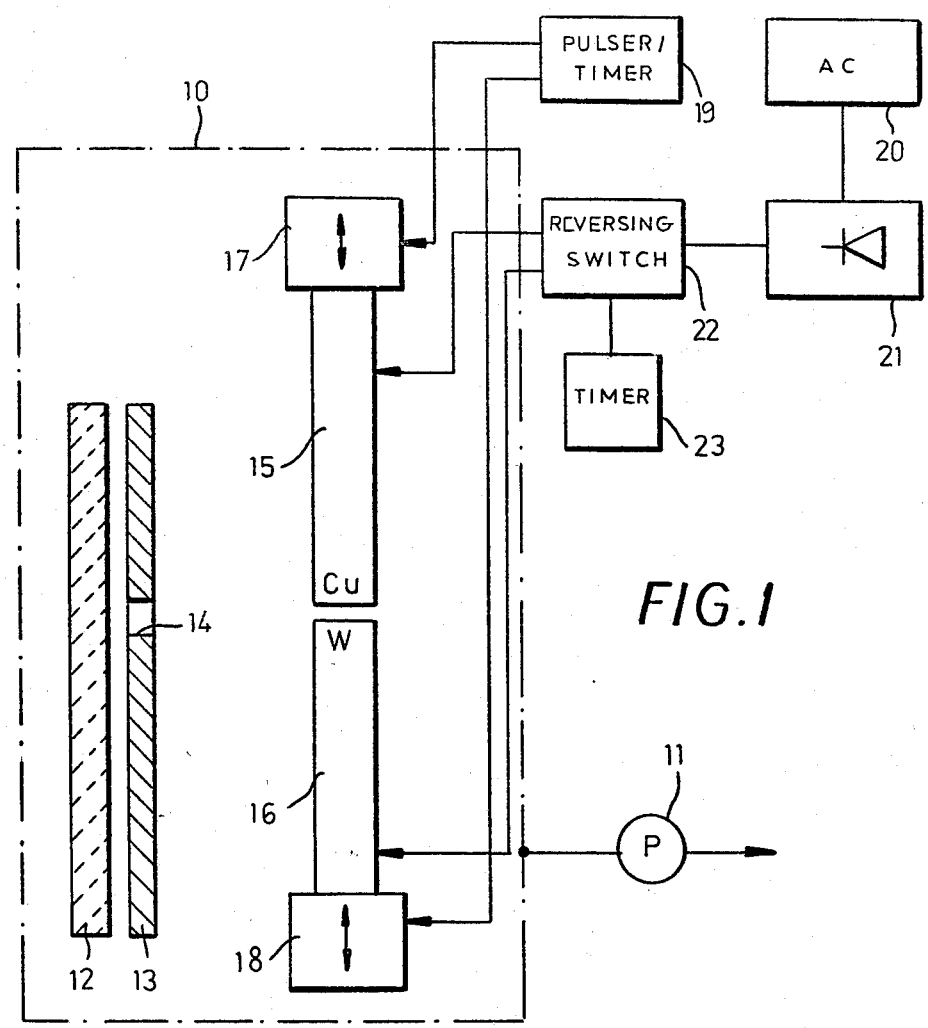
FIG. 1 is a diagram of an apparatus for carrying out the method of the present invention.

In FIG. 1 I have shown an apparatus, in a highly diagrammatic form, for carrying out the method of the invention. This apparatus, as described in the last mentioned copending application, comprises a chamber 10 which can be evacuated by a suction pump 11 to the desired degree of vacuum, generally $10^{-5}$ to $10^{-6}$ torr. Within this chamber, by means not shown, a ceramic substrate 12 can be disposed and can be shielded by a mask diagrammatically illustrated at 13 so that coating can only occur in regions defined by the windows 14 in the mask.

Within the vacuum chamber the portion of the substrate to be coated is juxtaposed with a pair of electrodes, i.e. a copper electrode 15 and a tungsten electrode 16, the electrodes being provided with means such as the electromagnetic motors (solenoids) 17 and 18 for briefly bringing them into contact to strike the arc and then drawing them apart. Such means have been described in the aforementioned copending applications which, as noted, are hereby incorporated by reference. The pulser for periodically energizing the devices 17 and 18 have been shown at 19.

The power supply comprises the alternating current source 20 which is connected to a rectifier 21 and the latter is provided with a reversing switch 22 which can reverse the polarity of the electrodes 15 and 16 under the control of a timer 23.

In operation with the copper electrode 15 poled positively and the tungsten 16 poled negatively an arc can be struck by passing an electric current of 30 to 100 amperes at a voltage of 40 to 100 volts through and across the gap after the electrodes briefly touch to preferentially vaporize tungsten and thus deposit tungsten through the window 14 of the mask 13 on the substrate. The duration of coating is controlled by the timer 23 which, after the coating of the order of microns in thickness has been applied, reverses the polarity so that the copper electrode 15 is now poled negatively and the tungsten electrode 16 is poled positively whereupon copper is vaporized from the electrode 15 and deposited upon the substrate.

Figure 2:
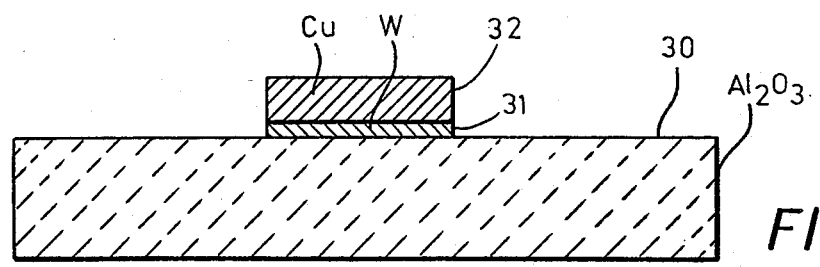
FIG. 2 is a cross-sectional view drawn to a larger scale of a product of the present invention.

As can be seen from FIG. 2, the resulting article has a substrate 30, e.g. of aluminum oxide, bearing a copper coating 32 which is separated by the refractory metal coating 31 (tungsten) of smaller thickness.

SPECIFIC EXAMPLES

EXAMPLE 1

Utilizing the principles described, a current of about 70 amperes, a voltage of 80 volts and a vacuum of about $10^{-5}$ torr, an aluminum oxide plate is coated with tungsten to a thickness of about 8 microns and with copper to a thickness of about 0.002 inches. The adhesion is measured and for the coating is found to be 500 to 700 lbs per square inch (force required to remove the coating). When under identical conditions a copper coating of the same thickness is applied to the same substrate, the adhesion is only 6 to 8 lbs per square inch. The direct copper-to-ceramic bond is found to be sensitive to both mechanical and thermal effects when a solder connection is made to it and with the copper/tungsten contact, formed according to the invention, no similar sensitivity was found.

Practically identical results could be obtained by substituting molybdenum, titanium and zirconium for the tungsten and with combinations of these refractory metals with one another and with tungsten as intermediate layers. Similarly, high degrees of adhesion were obtained with nickel, gold, silver and alloys thereof with one another and with copper.

Figure 3:
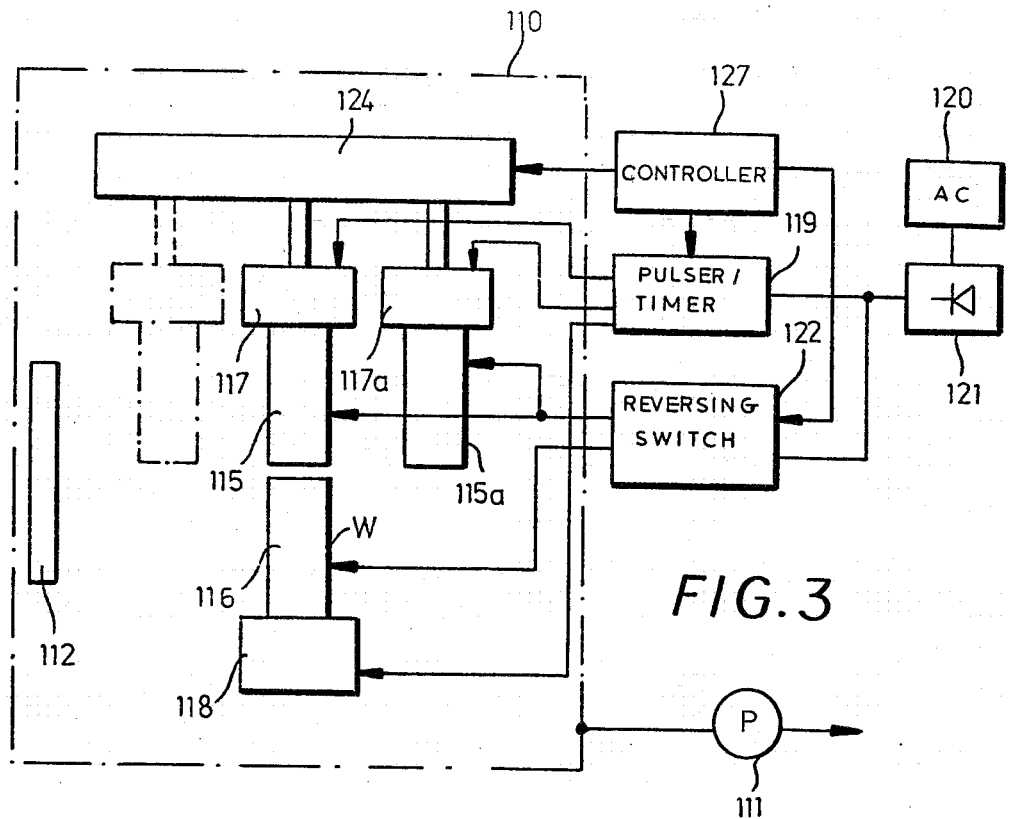
FIG. 3 is a view similar to FIG. 1 but illustrating another apparatus for carrying out the invention.

In FIG. 3, I have shown a modification of the apparatus of FIG. 1 in which the chamber 110, evacuated by the pump 11, includes a ceramic substrate 112 which is to be coated with a plurality of metals. In this case, in addition to the common electrode 116 and its actuator 118 driven by the pulser/timer 119, I provide a pair of counter-electrodes 115 and 115a, respectively of copper and gold, each with a respective actuator 117, 117a. The two counter-electrode assembly are provided on a track 124 having a drive enabling shifting of the two electrodes to the left as illustrated by the showing of the electrode 115 in its shifted position in dot-dash lines. Naturally, in the latter position, the electrode 115a is aligned with the common electrode 116. A reversing switch 122 as described in connection with FIG. 1 is here also provided and the apparatus is energized from the alternating current lines 120 through the rectifier 121.

In this mode of operation, once the chamber is evacuated, the actuators 117 and 118 are operated to move the electrodes 115 and 116 together and apart to strike an arc, the electrode 116 of tungsten being poled negatively while the electrode 115 of copper is poled positively.

This process is continued in the manner described until the initial coating of tungsten has been brought up to the desired thickness.

Figure 4:
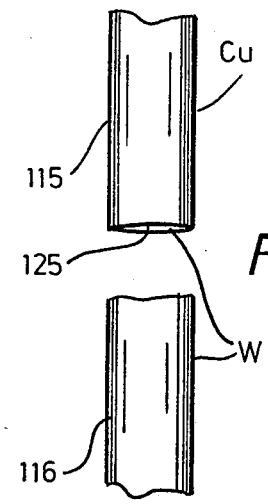
FIG. 4 is a diagram showing an effect obtained during the deposit of the metal for the first layer before the commencement of the second layer.

As can be seen from FIG. 4, this procedure not only results in erosion of the tungsten electrode 116 but it also gives rise to a small deposit 125 of tungsten on the copper electrode 115.

When the polarity is now reversed, i.e. the copper electrode 115 is poled positively and the tungsten electrode is poled negatively, the arc is struck and evaporation is effected from the copper electrode, the tungsten deposit 125, which has been exaggerated in thickness in FIG. 4, vaporizes together with copper and a mixed tungsten/copper deposit is produced as an interface.

Figure 5:
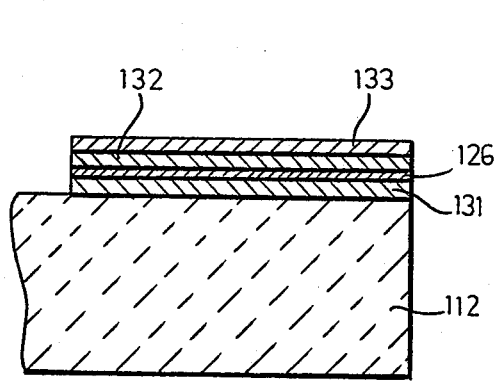
FIG. 5 is a cross-sectional view through the product in the latter case.

In FIG. 5, for example, the substrate 112 is shown to have been coated at 131 with the tungsten layer. The mixed or tungsten layer 126 is then applied thereto before, with continuation of the generation of vapor by arc-striking between the electrodes 115 and 116, the copper coating 132 is applied.

When the copper coating has reached the desired thickness, the electrode assembly 115, 117 is shifted to the left and replaced by the assembly 115a, 117a and the arc is struck between the electrodes 115a, 116 to deposit gold in a layer 133 upon the copper coating.

A controller 127 may be provided for the electrode shifting device 124, the pulser/timer 119 and the reversing switch 122 and may be controlled by a preprogrammed microprocessor to effect the polarity reversal and the switching of electrodes when layer thicknesses of the desired magnitude have been achieved.

EXAMPLE 2

The method of Example 1 is practiced except that the copper electrode is shifted away and replaced by a gold electrode. Utilizing the same vacuum and striking a similar arc, a flash coating in the order of the 5 microns range of gold was deposited upon the copper coating under the condition recited for copper deposition.

The adhesion was not diminished and the resulting gold layer was found to make an ideal contact for micro-electronic purposes. Investigations of the interface between copper and tungsten showed mixed transition zone 126 which was traced to the vaporization of a minor deposit of tungsten from the copper electrode.

I claim:

1. A method of making multilayer metal coatings on a substrate which comprises the steps of:
   juxtaposing a first electrode of a first metal with a second electrode of a second metal with one another and disposing a substrate in vapor-reversing relationship with said electrodes in a chamber;
   evacuating said chamber;
   striking an arc between said electrodes in said evacuated chamber while applying one electrical polarity to said first electrode and another electrical polarity to said second electrode to selectively vaporize metal from said first electrode and deposit same upon said substrate;
   thereafter reversing the polarities of said electrodes and striking an arc between them to selectively deposit metal from said second electrode on the metal from said first electrode previously deposited upon said substrate; and
   thereafter juxtaposing with one of said electrodes a substitute electrode and striking an arc between said substitute electrode and said one of said electrodes in said chamber to vaporize material from said substitute electrode and deposit same on said layer of the metal of said second electrode on said substrate.

2. The method defined in claim 1 wherein said substrate is a ceramic.

3. The method defined in claim 1 wherein said first electrode is composed of a refractory metal.

4. The method defined in claim 3 wherein said refractory metal is selected from the group which consists of tungsten, molybdenum, titanium, zirconium and alloys and combinations thereof.

5. The method defined in claim 1 wherein at least one of said second and substitute electrodes is composed of a metal selected from the group which consists of nickel, copper, gold, silver and alloys thereof.

6. The method defined in claim 1 wherein the layer of the metal of said first electrode is applied in a thickness of the order of microns and the layer formed by one of said second and substitute electrodes has a thickness of 0.01 to 0.02 inches.

7. A method of coating a substrate which comprises the steps of:
   juxtaposing a pair of electrodes of different metals with a substrate in a chamber;
   evacuating said chamber;
   applying one electrical polarity to one of said electrodes and the opposite electrical polarity to the other of said electrodes and striking an arc between said electrodes by approximating them into contact and drawings them apart to vaporize material from said one of said electrodes and deposit the vaporized material on said substrate in a first layer while simultaneouly transferring a portion of said material onto the other of said electrodes; and
   thereupon reversing the electrical polarity of said electrodes and striking an arc between them to vaporize material from said other electrode including said portion and deposit a mixed layer of materials from both of said electrodes on said first layer as a transition layer and thereafter deposit material from said second electrode onto said transition layer, said other electrode being thereafter shifted out of alignment with said one of said electrodes and being replaced by a substitute electrode with which an arc is struck in said chamber to deposit a further material on said material of said other electrode.

8. An apparatus for multilayer coating of a substrate which comprises:
   a chamber;
   means for evacuating said chamber;
   a substrate adapted to be coated being positioned in said chamber;
   a pair of first electrodes juxtaposed with one another in said chamber;
   means for applying an electrical potential to said electrodes with one of said electrodes having one electrical polarity and the other of said electrodes having the opposite electrical polarity;
   means for approximating said electrodes and drawing them apart to strike an arc between said electrodes selectively vaporizing material of said one of said electrodes for deposit upon said substrate in a first layer;

means for reversing the polarities on said electrodes whereby said electrodes strike an arc to deposit material selectively from said other of said electrodes on said first layer; and means in said chamber for automatically replacing one of the first mentioned electrodes with a substitute electrode and striking an arc between the remaining one of the first mentioned electrodes and said substitute electrode to deposit material of said substitute electrode selectively on said substrate.

* * * * *